(12) United States Patent
Seok et al.

(10) Patent No.: US 9,236,441 B2
(45) Date of Patent: Jan. 12, 2016

(54) NITRIDE-BASED SEMICONDUCTOR DEVICE AND METHOD FOR MANUFACTURING THE SAME

(71) Applicant: Seoul National University R&DB Foundation, Seoul (KR)

(72) Inventors: Ogyun Seok, Seoul (KR); Woojin Ahn, Seoul (KR); Min-Koo Han, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 10 days.

(21) Appl. No.: 14/028,135

(22) Filed: Sep. 16, 2013

(65) Prior Publication Data

US 2014/0138700 A1    May 22, 2014

(30) Foreign Application Priority Data

Nov. 22, 2012 (KR) .................. 10-2012-0132765
Feb. 22, 2013 (KR) .................. 10-2013-0019245
May 9, 2013 (KR) .................. 10-2013-0052376

(51) Int. Cl.
*H01L 29/778* (2006.01)
*H01L 21/316* (2006.01)
*H01L 29/51* (2006.01)
*H01L 29/47* (2006.01)
(Continued)

(52) U.S. Cl.
CPC ........ *H01L 29/517* (2013.01); *H01L 21/28264* (2013.01); *H01L 21/28581* (2013.01); *H01L 21/7605* (2013.01); *H01L 29/475* (2013.01); *H01L 29/66212* (2013.01); *H01L 29/66462* (2013.01); *H01L 29/7787* (2013.01); *H01L 29/872* (2013.01); *H01L 29/2003* (2013.01); *H01L 29/42356* (2013.01); *H01L 29/42376* (2013.01)

(58) Field of Classification Search
CPC .................. H01L 29/66446; H01L 29/66462; H01L 29/66522; H01L 29/778; H01L 29/7786; H01L 29/7787; H01L 29/7839
See application file for complete search history.

(56) References Cited

U.S. PATENT DOCUMENTS

| 7,851,825 | B2 * | 12/2010 | Suh et al. ................. 257/194 |
| 2006/0145201 | A1 * | 7/2006 | Shiga ........................ 257/280 |
| 2006/0197107 | A1 * | 9/2006 | Kanamura et al. ............ 257/194 |

(Continued)

FOREIGN PATENT DOCUMENTS

| JP | 2008-258315 | 10/2008 |
| JP | 2012-084653 | 4/2012 |
| KR | 1020060057928 | 5/2006 |

*Primary Examiner* — Whitney T Moore
*Assistant Examiner* — Scott Stowe
(74) *Attorney, Agent, or Firm* — Mintz Levin Cohn Ferris Glovsky and Popeo, P.C.; Kongsik Kim; Colleen H. Witherell

(57) ABSTRACT

A method for manufacturing a nitride-based semiconductor device includes: preparing a substrate; forming a buffer layer on the substrate, the buffer layer preventing dislocation with the substrate; forming a spacer on the buffer layer; forming a barrier layer on the spacer, the barrier layer forming a heterostructure with the spacer; forming a protecting layer on the barrier layer; and forming an HfO$_2$ layer the protecting layer through RF sputtering.

12 Claims, 18 Drawing Sheets

(51) Int. Cl.
*H01L 29/66* (2006.01)
*H01L 29/872* (2006.01)
*H01L 21/28* (2006.01)
*H01L 21/285* (2006.01)
*H01L 21/76* (2006.01)
*H01L 29/423* (2006.01)
*H01L 29/20* (2006.01)

(56) References Cited

U.S. PATENT DOCUMENTS

2008/0246060 A1 10/2008 Koyama et al.
2011/0018002 A1* 1/2011 Chen et al. ............. 257/76

* cited by examiner

| PROTECTING LAYER | ~2350 |
|---|---|
| BARRIER LAYER | ~2340 |
| SPACER | ~2330 |
| BUFFER LAYER | ~2320 |
| SUBSTRATE | ~2310 |

FIG.23

↓ ↓ ↓ RF-SPUTTERING

| $HfO_2$ LAYER | ~2360 |
|---|---|
| PROTECTING LAYER | ~2350 |
| BARRIER LAYER | ~2340 |
| SPACER | ~2330 |
| BUFFER LAYER | ~2320 |
| SUBSTRATE | ~2310 |

FIG.24

NITRIDE-BASED SEMICONDUCTOR DEVICE AND METHOD FOR MANUFACTURING THE SAME

PRIORITY

This application claims the priority under 35 U.S.C. §119 (a) to Korean Application Serial Nos. 10-2012-0132756, 10-2013-0019245, and 10-2013-0052376, which were filed in the Korean Intellectual Property Office on Nov. 22, 2012, Feb. 22, 2013, and May 9, 2013, the entire content of which is hereby incorporated by reference.

BACKGROUND OF THE INVENTION

1. Field of the Invention

The present invention relates to a method for manufacturing a nitride-based semiconductor device, and more particularly, to a method for manufacturing a nitride-based semiconductor device capable of increasing a breakdown voltage.

2. Description of the Related Art

The present invention is directed to a nitride-based semiconductor device and a method for manufacturing the same, and more particularly, to a structure of increasing a breakdown voltage and decreasing a leakage current in a GaN-based semiconductor device and a method for manufacturing the same.

Recently, gallium nitride (GaN), silicon carbide (SiC), and the like, which are wide band-gap materials, are being spotlighted in a field of power electric systems. Particularly, GaN has superior material properties to the other semiconductor materials, such as high critical electric field, high electron mobility, high electron saturation velocity, and the like, and thus it has been widely used for high-frequency, high-power, and high-temperature semiconductor devices.

Meanwhile, an AlGaN/GaN hetero-structure has a discontinuous conduction band between AlGaN and GaN and a high Two-Dimensional Electron Gas (2DEG) concentration due to a piezoelectric effect.

Accordingly, a High-Electron-Mobility Transistor (HEMT) and a lateral Schottky barrier diode manufactured on the AlGaN/GaN hetero-structure have a high 2DEG concentration ($10^{13}$ $cm^{-2}$) and a high critical electric field, and thus have been widely studied in fields of high-voltage switches and high-frequency amplifiers.

However, the conventional AlGaN/GaN HEMT has drawbacks in that the breakdown voltage and critical electric field are relatively low and thus the leakage current is relatively large. Moreover, the conventional AlGaN/GaN HEMT has drawbacks in that the normally-off state is difficult to maintain.

For these reasons, a Metal-Oxide-Semiconductor (MOS) structure was appointed as an appropriate structure for the high-voltage AlGaN/GaN HEMT, and thus studies on a gate insulating layer have been actively conducted. For example, $SiO_2$, $Si_3N_4$ and the like were used for the gate insulating layer in the previous studies, but they are problematic since they need to be formed in a thin film type to achieve a low dielectric constant (k). However, the thin film type of gate insulating layer may cause hot carriers, resulting in a gate leakage current. Thus, the introduction of gate insulating layers capable of increasing the breakdown voltage and having a high on/off current ratio is required.

Meanwhile, the conventional nitride-based semiconductor adopted Ni for contacts. However, the nitride-based semiconductor including Ni contacts has a drawback of strong internal stress. Additionally, since Ni is easily oxidized, an additional component such as an Au layer needs to be laminated on Ni. Moreover, the inter-fusion between AlGaN/GaN and a metal material causes deterioration in electron characteristics during a high-temperature treatment procedure.

Moreover, the conventional semiconductor device has an internal resistance due to the distance between a source electrode and a gate electrode. For this reason, as the distance between the source electrode and the gate electrode increases, the internal resistance becomes greater, which may cause deterioration in on-resistance.

Accordingly, the development of semiconductor devices capable of decreasing an internal resistance due to the distance between the source electrode and the gate electrode is required.

SUMMARY OF THE INVENTION

Accordingly, an aspect of the present invention is to provide a method for manufacturing a nitride-based semiconductor device using Radio-Frequency (RF) sputtering.

In accordance with an aspect of the present invention, a method for manufacturing a nitride-based semiconductor device is provided. The method includes: preparing a substrate; forming a buffer layer on the substrate, the buffer layer preventing dislocation with the substrate; forming a spacer on the buffer layer; forming a barrier layer on the spacer, the barrier layer forming a hetero-structure with the spacer; forming a protecting layer on the barrier layer; and forming an $HfO_2$ layer the protecting layer through RF sputtering.

In accordance with another aspect of the present invention, a method for manufacturing a nitride-based semiconductor device is provided. The method includes: forming a nitride-based semiconductor layer including GaN in a surface thereof; performing a mesa process on the nitride-based semiconductor layer to form a mesa structure; and forming Schottky contacts of TaN on the mesa structure.

In accordance with another aspect of the present invention, a nitride-based semiconductor device is provided. The nitride-based semiconductor includes: an insulating substrate; a buffer layer formed on the insulating substrate, the buffer layer being formed of a first nitride-based semiconductor; an AlGaN layer formed on the buffer layer to thereby form a two-dimensional electron gas layer, the two-dimensional electron gas layer being interposed between the AlGaN layer and the buffer layer; a GaN layer formed on the AlGaN layer; and Schottky contacts of TaN formed on the GaN layer.

In accordance with another aspect of the present invention, a method for manufacturing a semiconductor device is provided. The method includes: preparing a semiconductor layer; forming a source electrode on a first region of the semiconductor layer; forming a drain electrode on a second region of the semiconductor layer; forming an insulating layer on a third region of the semiconductor layer and a portion of the source electrode; and forming a gate electrode to be extended from a portion of the insulating layer to above the source electrode.

In accordance with another aspect of the present invention, a semiconductor device is provided. The semiconductor includes: a semiconductor layer; a source electrode formed on a first region of the semiconductor layer; a drain electrode formed on a second region of the semiconductor layer; an insulating layer formed on a third region of the semiconductor layer and a portion of the source electrode; and a gate electrode extended from a portion of the insulating layer to above the source electrode.

BRIEF DESCRIPTION OF THE DRAWINGS

The above and other aspects, features, and advantages of the present invention will be more apparent from the following detailed description taken in conjunction with the accompanying drawings, in which:

FIG. 23 is a cross-sectional view of a structure during manufacturing of a nitride-based semiconductor device according to an exemplary embodiment of the present invention;

FIG. 24 is a conceptual view for illustrating a method for manufacturing a nitride-based semiconductor device according to a comparative embodiment of the present invention;

DETAILED DESCRIPTION OF EMBODIMENTS OF THE PRESENT INVENTION

Figure 1:
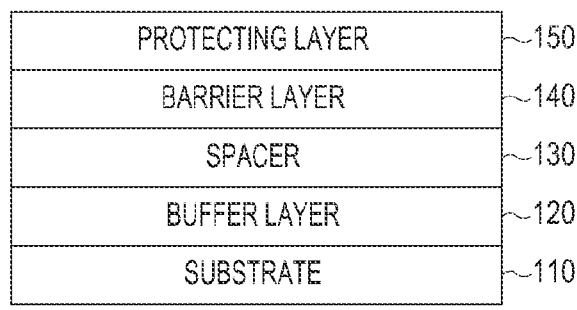
FIG. 1 is a cross-sectional view of a structure during manufacturing of a nitride-based semiconductor device according to an exemplary embodiment of the present invention.

Hereinafter, illustrative embodiments according to the present invention will be described with reference to descriptions discussed through the accompanying drawings. However, the present invention is not limited or restricted by the illustrative embodiments. The same reference numerals shown in respective drawings indicate members for substantially performing the same function.

FIG. 1 is a cross-sectional view of a structure during manufacturing of a nitride-based semiconductor device according to an exemplary embodiment of the present invention.

To manufacture a nitride-based semiconductor device, a substrate 110 may be prepared as shown in FIG. 1. The substrate 110 according to the exemplary embodiment of the present invention may consist of Si. However, Si is only an example, and thus those skilled in the art can easily substitute or change Si with sapphire, silicon carbide, or the like.

Meanwhile, in an exemplary embodiment of the present invention, the substrate 110 may be washed before a buffer layer 120 is formed on the substrate 110. The substrate 110 may be washed with trichloroethylene (TCE), aceton, and methanol solutions. Further, after washing with the foregoing solutions is completed, the substrate 110 may be washed with a 4:1-$H_2SO_4$ and $H_3PO_4$ mixture solution and deionized water.

The buffer layer 120 may be formed on the substrate 110. The buffer layer 120 may include GaN. The buffer layer 120 may be grown to have a thickness of, for example, several micrometers, favorably 3.9 μm, on the substrate 110. When the buffer layer 120 is grown on the substrate 110, the buffer layer 120 may be first grown at a slow rate under high pressure conditions for, for example, 40 minutes, and may be then grown at a fast rate under low pressure conditions for, for example, 45 minutes. The buffer layer 120 may include, for example, C-doped GaN, for high-resistance characteristics.

The buffer layer 120 may be grown by a conventional process, such as Metal Organic Chemical Vapor Deposition (MOCVD) or Molecular Beam Epitaxy (MBE). Since the growing of the buffer layer 120, for example, GaN, is not a central scope of the present invention and is known in the art, detailed descriptions thereof will be omitted herein.

Meanwhile, although not shown, with respect to a method for manufacturing a nitride-based semiconductor device according to another exemplary embodiment of the present invention, a transition layer (not shown) may be formed between the substrate 110 and the buffer layer 120. As described above, the buffer layer 120 may include GaN. However, since GaN and sapphire, SiC, Si, or the like used for the substrate have a large difference in the lattice constant or coefficient of thermal expansion, GaN directly laminated on the substrate 110 may cause a line defect (dislocation) and thus a leakage current. The transition layer (not shown) can decrease the difference in the lattice constant or coefficient of thermal expansion between the substrate 110 and the buffer layer 120 and thus prevent the flowing of the leakage current. Further, those skilled in the art can deduce, by using the known art, a constitution that another layer is inserted between the substrate 110 and the transition layer (not shown), between the transition layer (not shown) and the buffer layer 120, or on the buffer layer 120, thereby further decreasing the difference in the lattice constant or coefficient of thermal expansion.

A spacer 130 may be formed on the buffer layer. Here, the spacer 130 may include, for example, GaN, and may be formed with a thickness of 100 nm.

In an exemplary embodiment of the present invention, the spacer 130 may include GaN, and a barrier layer 140 may include AlGaN, so that a GaN/AlGaN hetero-structure may be formed. The lattice constant of AlGaN is smaller than that of GaN, and thus a tensile force due to lattice mismatching may be applied to the barrier layer 140, resulting in a piezo-electric effect that induces polarization in the barrier layer 140.

The piezoelectric effect of the AlGaN/GaN hetero-structure may lead to the formation of 2DEG, which may be used as a channel of the semiconductor device. In particular, in the case of the GaN/AlGaN hetero-structure, the discontinuity of the conduction band has a value greater than, for example, 0.65 eV. The thus formed 2DEG may have an electron mobility of 1500 cm$^3$/V·s and an electron saturation velocity of 2.2×10$^7$ cm/s based on, for example, room temperature.

Meanwhile, the barrier layer 140 may be formed with a thickness of 20 nm. The barrier layer 140 may include AlGaN. In Al$_x$Ga$_{1-x}$N, the value of x may be determined to be greater than 0 but smaller than 1, and thus the energy gap of Al$_x$Ga$_{1-x}$N may be controlled to be 3.4 eV to 6.2 eV. The content ratio of Al and Ga may be determined to be 0.23:0.77, to thereby realize Al$_{0.23}$Ga$_{0.77}$N.

A protecting layer 150 may be formed on the barrier layer 140. Here, the protecting layer 150 may include, for example, GaN, and may be formed with a thickness of 3 nm. As described above, the growing of GaN may be achieved by a conventional process, such as MOCVD or MBE.

The protecting layer 150 may shut off the barrier layer 140 from the outside, which will be later described in detail. The protecting layer 150 may include an impurity layer therein.

Figure 2:
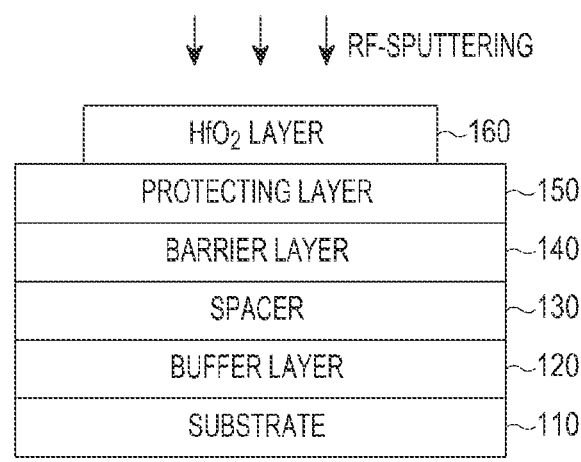
FIG. 2 is a conceptual view for describing a method for manufacturing a nitride-based semiconductor device according to an exemplary embodiment of the present invention.

FIG. 2 is a conceptual view for illustrating a method for manufacturing a nitride-based semiconductor device according to an exemplary embodiment of the present invention.

As shown in FIG. 2, an HfO$_2$ layer 160 may be formed on a protecting layer 150. In particular, the HfO$_2$ layer 160 may be formed by RF sputtering. The RF sputtering has gained attention due to a low temperature, a low cost, and superior thickness control thereof. In addition, the RF sputtering has an advantage in that there is formed a layer having the same composition ratio as a source material. Besides, the HfO$_2$ layer 160 formed by RF sputtering can result in a high on/off current ratio and a high breakdown voltage. The HfO$_2$ layer 160 may be formed with a thickness of, for example, 15 nm, and the RF sputtering power may be 50 W. In addition, the HfO$_2$ layer 160 may be formed at room temperature under an Ar flow of 15 ccm or smaller, and the pressure at the time of forming the HfO$_2$ layer 160 may be 3 mTorr. The HfO$_2$ layer 160 may be formed at a deposition rate of, for example, 0.5 nm/s.

Meanwhile, although not shown, a mesa structure may be formed by conducting a mesa process before the HfO$_2$ layer 160 is formed. In this case, a portion excluding an active region of the semiconductor device may be etched. For example, the active region of the semiconductor device is defined, and the etching may be performed by using an Inductively Coupled Plasma (ICP)-etcher in the atmosphere of Cl$_2$.

Figure 3:
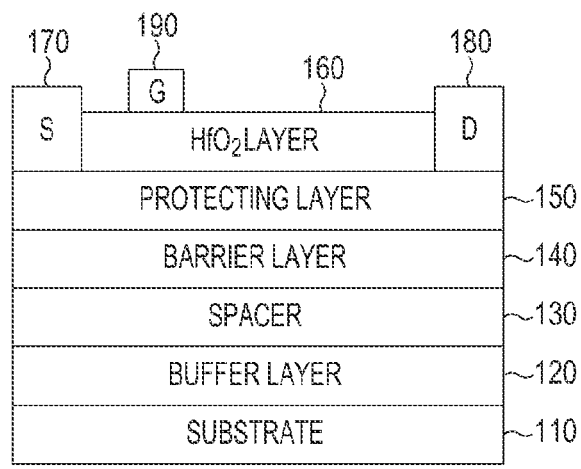
FIG. 3 is a cross-sectional view of a structure during manufacturing of a nitride-based semiconductor device according to an exemplary embodiment of the present invention.

FIG. 3 is a cross-sectional view of a structure during manufacturing of a nitride-based semiconductor device according to an exemplary embodiment of the present invention. As shown in FIG. 3, an HfO$_2$ layer 160 may be formed, and a source electrode 170 and a drain electrode 180 may be formed on a protecting layer 150. In addition, a gate electrode 190 may be formed on the HfO$_2$ layer 160. The gate electrode 190 may be relatively closer to the source electrode 170 than the drain electrode 180. FIG. 3 shows that the source electrode 170 and the drain electrode 180 are formed after the HfO$_2$ layer 160 is formed, but this is merely given as an example. The source electrode 170 and the drain electrode 180 may be formed in advance on the protecting layer 150 before the HfO$_2$ layer 160 is formed.

The source and drain electrodes 170 and 180 may be formed by sequentially depositing Ti/Al/Ni/Au with respective thicknesses of 20 nm, 80 nm, 20 nm, and 100 nm, followed by a lift-off process, and then annealed at 880° C. in the atmosphere of N$_2$ for 40 seconds.

After the source and drain electrodes 170 and 180 are formed, a subsequent heating process may be further performed at 400° C. in the atmosphere of O$_2$ having a flow rate of 4 Standard Liters per Minute (SLPM) for 5 minutes. The gate electrode 190 may be formed by depositing Ni/Au with respective thicknesses of, for example, 30 nm and 150 nm, by using an e-gun evaporator. A lift-off method may be employed for patterning. Also, the gate electrode 190 may include at least one of Ni, Pt, Ir, Pd, Mo, and Au.

Through the foregoing procedure, there can be manufactured a nitride-based semiconductor device including the HfO$_2$ layer 160 formed by RF sputtering.

Figure 4:
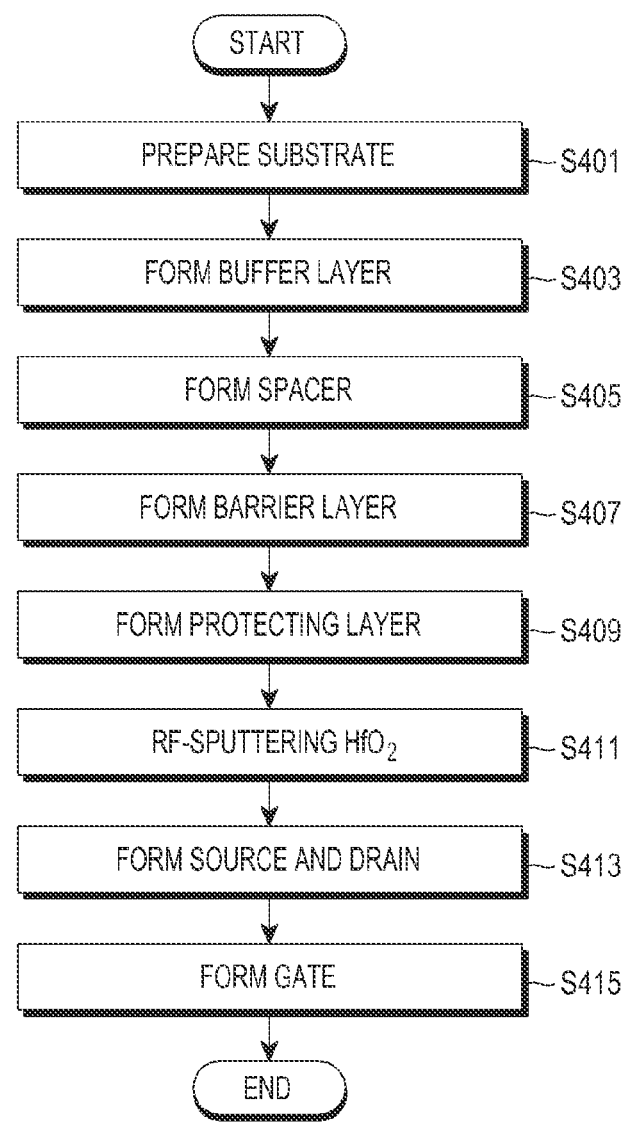
FIG. 4 is a flowchart for illustrating a method for manufacturing a nitride-based semiconductor device according to an exemplary embodiment of the present invention.

FIG. 4 is a flowchart for illustrating a method for manufacturing a nitride-based semiconductor device according to an exemplary embodiment of the present invention.

As shown in FIG. 4, for manufacturing a nitride-based semiconductor device, a substrate is first prepared (S401).

After the substrate is prepared, a buffer layer is formed on the substrate (S403). After the buffer is formed, a spacer is formed on the buffer layer (S405). After the spacer is formed, a barrier layer is formed on the spacer (S407). After the barrier is formed, a protecting layer is formed on the barrier layer (S409). After the protecting layer is formed, an $HfO_2$ layer is formed by RF sputtering (S411). After the $HfO_2$ layer is formed, source and drain electrodes are formed (S413). After the source and drain electrodes are formed, a gate electrode is formed (S415). Meanwhile, as described above, in the method for manufacturing the nitride-based semiconductor device, after the source and drain electrodes are formed in advance, the $HfO_2$ layer may be formed by RF sputtering.

Hereinafter, effects of the present invention will be described based on experimental data.

Figure 5:
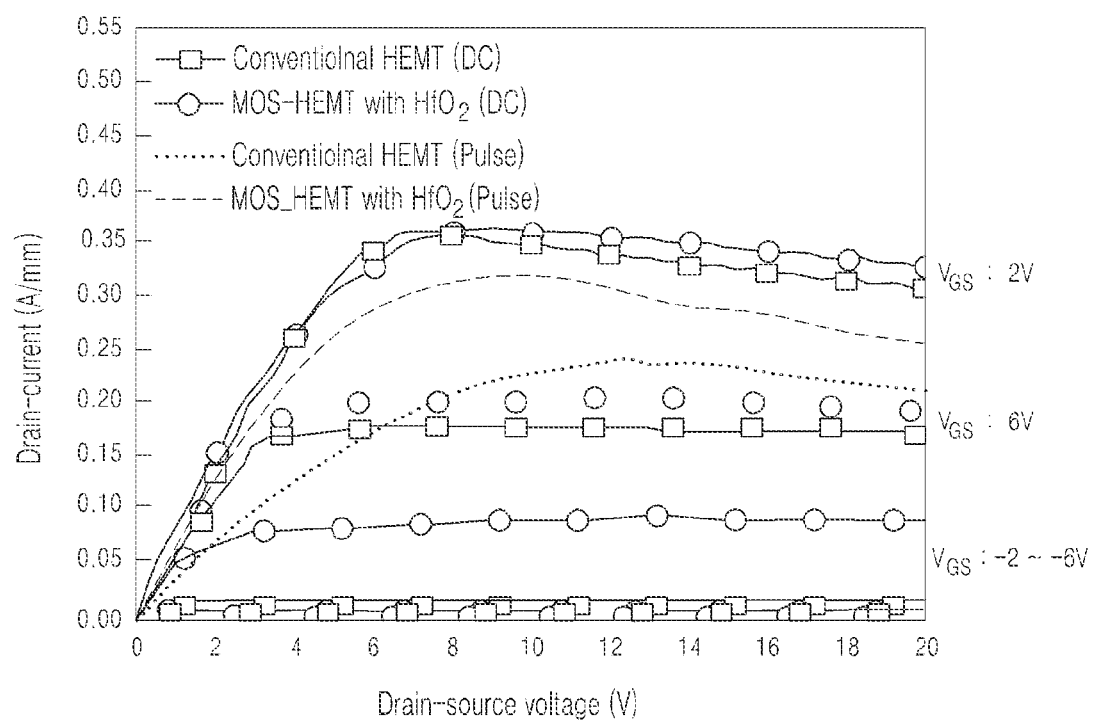
FIG. 5 is a graph showing DC and pulse output characteristics in a conventional High-Electron-Mobility Transistor (HEMT) and a HEMT with an $HfO_2$ layer by Radio Frequency (RF) sputtering according to the present invention.

FIG. 5 is a graph showing DC and pulse outputs in a conventional High Electron Mobility Transistor (HEMT) and a HEMT with an $HfO_2$ layer by Radio Frequency (RF) sputtering of the present invention. As seen from FIG. 5, the drain current density of the conventional HEMT is 363 nA/mm when $V_{GS}$ is 2 V. Meanwhile, it may be confirmed that the pulsed gate condition and drain bias of the HEMT with an $HfO_2$ layer by RF sputtering of the present invention are lower than those of the conventional HEMT. This may mean that the HEMT with an $HfO_2$ layer by RF sputtering of the present invention suppresses the surface trap effects or prevents a current collapse.

Figure 6:
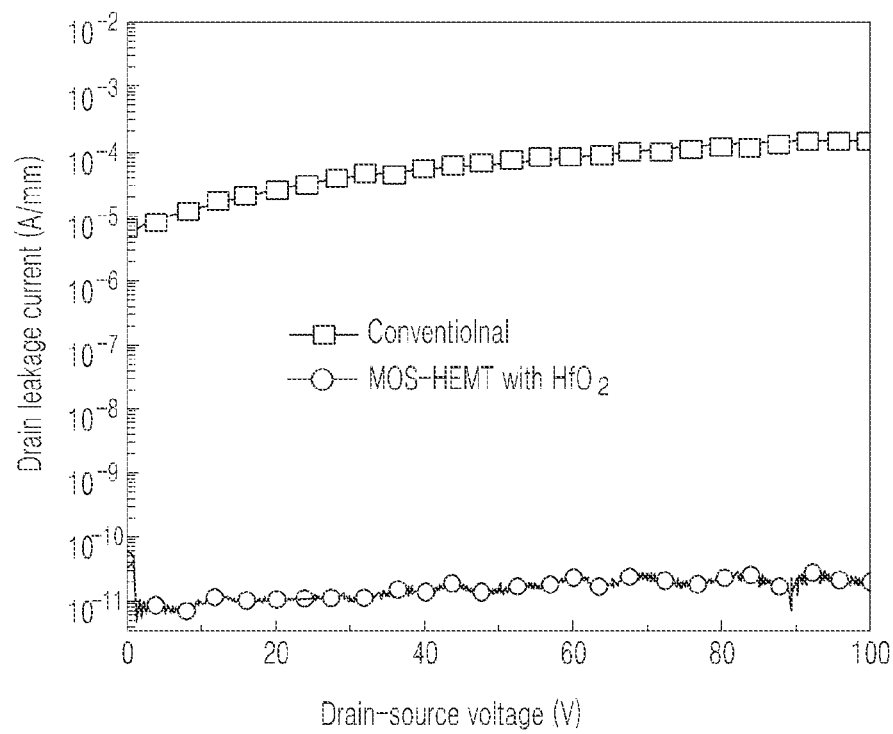
FIG. 6 is a graph showing the drain leakage current in a conventional HEMT and a HEMT with an $HfO_2$ layer by RF sputtering according to the present invention.

FIG. 6 is a graph showing the drain leakage current in a conventional HEMT and a HEMT with an $HfO_2$ layer by RF sputtering of the present invention. The drain leakage current is measured at $V_{GS}$ of −10 V while increasing $V_{DS}$ to 100 V. It may be confirmed that the HEMT with an $HfO_2$ layer by RF sputtering of the present invention has a low drain leakage current value of 67 pA/mm when $V_{DS}$ is 100 V. Meanwhile, the conventional HEMT has a high leakage current, 193 µA/mm, which results from the surface state such as dislocation on the GaN buffer/substrate interface or N vacancies generated by plasma and thermal processes. Further, it may be confirmed that the drain leakage current of the conventional HEMT is increased to 496 µA/mm after DC stress ($V_{GS}$=−10 V, $V_{DS}$=100 V, time=100 s), but the HEMT with an $HfO_2$ layer by RF sputtering of the present invention does not show the above increase. In addition, it may be confirmed that the surface leakage current of two ohmic contacts is also decreased by $10^6$ fold as compared with the previous deposition. The reduced drain leakage current is due to the fact that the Schottky tunneling and the surface leakage current caused by electron trapping are suppressed by the $HFO_2$ gate insulating layer.

Figure 7:
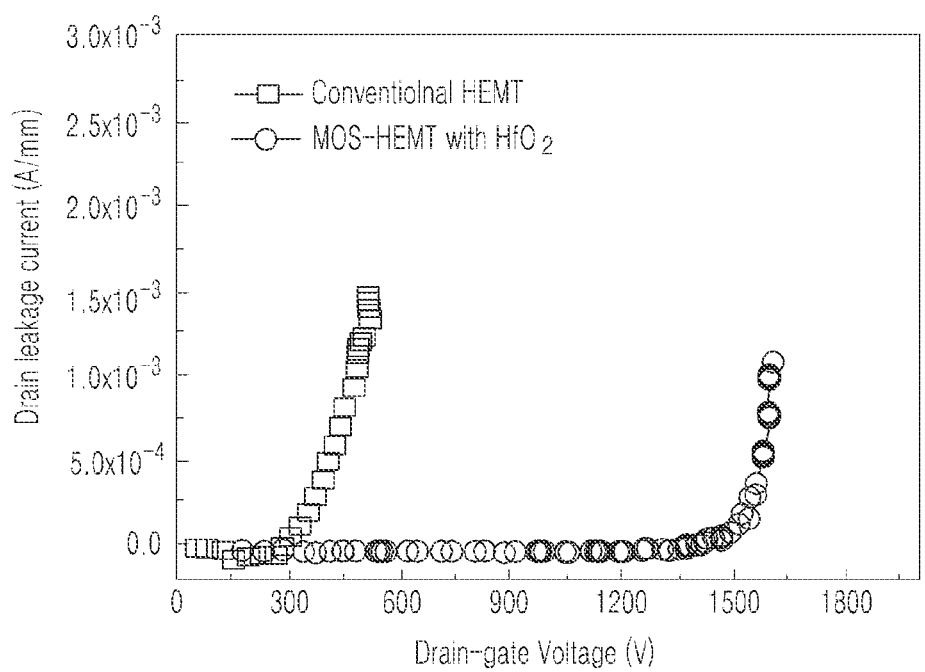
FIG. 7 is a graph showing the terminal breakdown voltage in a conventional HEMT and a HEMT with an $HfO_2$ layer by RF sputtering according to the present invention.

FIG. 7 is a graph showing the terminal breakdown voltage in a conventional HEMT and a HEMT with an $HfO_2$ layer by RF sputtering of the present invention. Here, the terminal breakdown voltage is measured when the drain leakage current is 1 mA/mm. The terminal breakdown voltage of the HEMT with an $HfO_2$ layer by RF sputtering of the present invention is 1526 V. Whereas, the terminal breakdown voltage of the conventional HEMT is 470 V. Therefore, it may be confirmed that the terminal breakdown voltage of the HEMT with an $HfO_2$ layer by RF sputtering of the present invention is increased.

Figure 8:
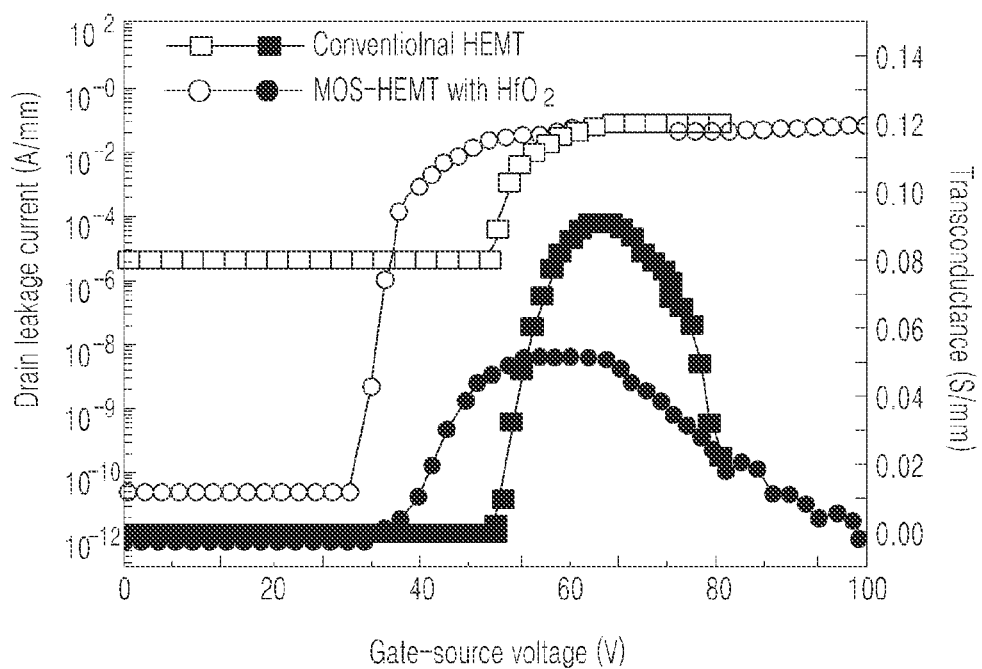
FIG. 8 is a graph showing the transfer curve when $V_{DS}$ is 5V in a conventional HEMT and a HEMT with an $HfO_2$ layer by RF sputtering according to the present invention.

FIG. 8 is a graph showing the transfer curve when $V_{DS}$ is 5 V in a conventional HEMT and a HEMT with an $HfO_2$ layer by RF sputtering of the present invention. Here, the on/off current ratio is determined at $I_{D,ON}$ when $V_{GS}$=0 V and $I_{D,OFF}$ when $V_{GS}$=−10 V. It may be confirmed that the on/off current ratio of the HEMT with an $HfO_2$ layer by RF sputtering of the present invention ($2.37 \times 10^{10}$; $I_{D,ON}$=8.01 pA/mm and $I_{D,ON}$=175 µA/mm) is greatly increased as compared with that of the conventional HEMT ($7.61 \times 10^3$; $I_{D,ON}$=23 µA/mm and $I_{D,ON}$=175 mA/mm).

The high on/off current ratio indicates that the HEMT with an $HfO_2$ layer by RF sputtering of the present invention successfully suppresses the gate leakage current as well as the isolation leakage current from the drain to the source. The $V_{TH}$ value of the conventional HEMT is −2.3 V and the $V_{TH}$ value of the HEMT with an $HfO_2$ layer by RF sputtering of the present invention is −4.2 V.

Figure 9:
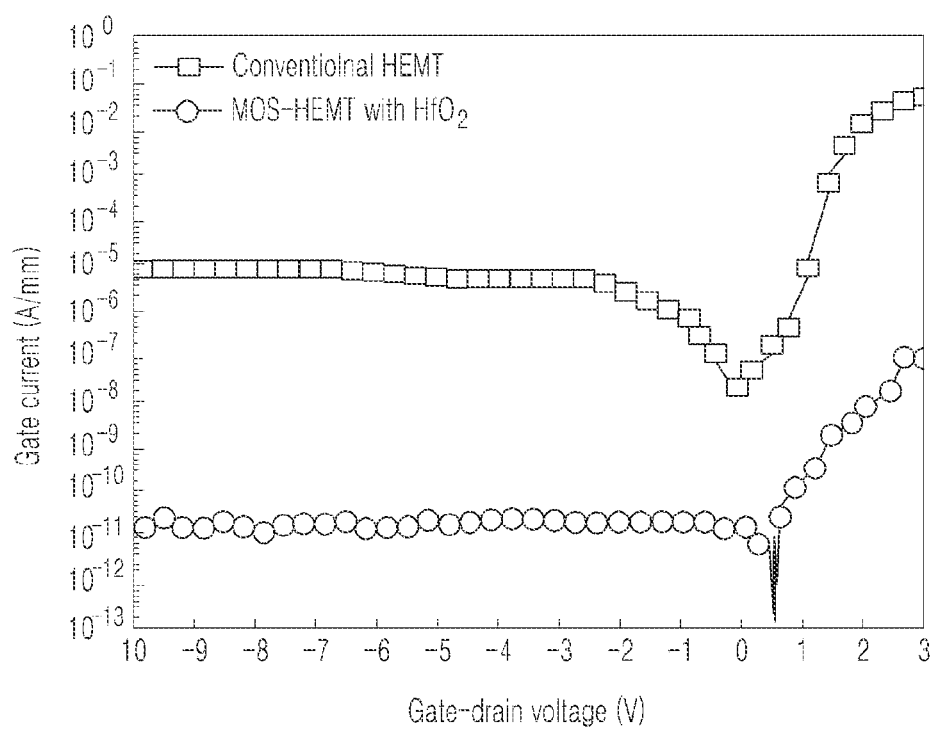
FIG. 9 is a graph showing I-V characteristics in a conventional HEMT and a HEMT with an $HfO_2$ layer by RF sputtering according to the present invention.

FIG. 9 is a graph showing I-V characteristics in a conventional HEMT and a HEMT with an $HfO_2$ layer by RF sputtering of the present invention. It may be confirmed that the HEMT with an $HfO_2$ layer by RF sputtering of the present invention blocks the leakage current under both positive and negative biases. The forward leakage current of the HEMT with an $HfO_2$ layer by RF sputtering of the present invention is 11 nA/mm when $V_{GD}$=3 V, while that of the conventional HEMT is 56 mA/mm under the same condition. The reverse leakage current of the HEMT with an $HfO_2$ layer by RF sputtering of the present invention is −33 pA/mm when $V_{GD}$=−10 V, while that of the conventional HEMT is −9.7 µA/mm under the same condition.

Therefore, it may be confirmed that the HEMT with an $HfO_2$ layer by RF sputtering of the present invention blocks the forward leakage current.

Figure 10:
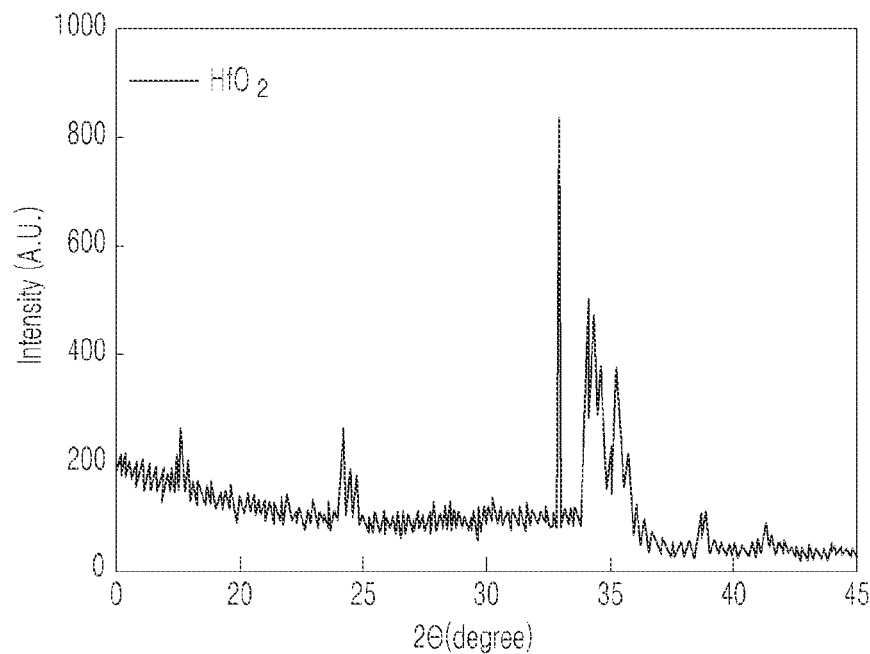
FIG. 10 shows an X-ray diffraction (XRD) pattern in a HEMT with an $HfO_2$ layer by RF sputtering according to the present invention.

FIG. 10 shows an X-ray diffraction (XRD) pattern in a HEMT with an $HfO_2$ layer by RF sputtering of the present invention. The result shown in FIG. 10 is for a case where a 300 nm-thick $HfO_2$ layer is sputtered onto a p-type Si substrate. The $HfO_2$ layer shows weak peaks at (2 0 0) and (2 2 0). The weakly crystallized $HfO_2$ layer has effects of blocking the dielectric leakage current and surface leakage current.

Figure 11:
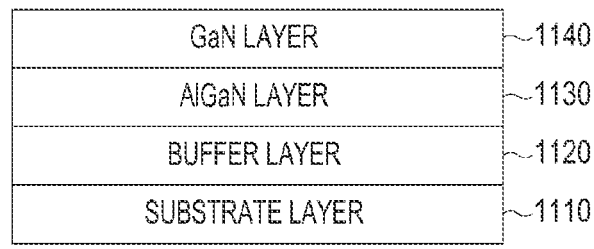
FIG. 11 is a cross-sectional view of a structure during manufacturing of a nitride-based semiconductor device according to an exemplary embodiment of the present invention.

FIG. 11 is a cross-sectional view of a structure during manufacturing of a nitride-based semiconductor device according to an exemplary embodiment of the present invention.

As shown in FIG. 11, with respect to the manufacture of a nitride-based semiconductor device, a substrate 1110 may be prepared. The substrate 1110 according to an exemplary embodiment of the present invention may consist of Si. However, Si is only an example, and thus those skilled in the art can easily substitute or change Si with sapphire, silicon carbide, or the like.

Meanwhile, in an exemplary embodiment of the present invention, the substrate 1110 may be washed before a buffer layer 1120 is formed on the substrate 1110. The substrate 1110 may be washed with trichloroethylene (TCE), aceton, and methanol solutions. Further, after washing with the foregoing solutions is completed, the substrate 1110 may be washed with a 4:1-$H_2SO_4$ and $H_3PO_4$ mixture solution and deionized water.

The buffer layer 1120 may be formed on the substrate 1110. The buffer layer 1120 may include GaN. The buffer layer 1120 may be grown to have a thickness of, for example, several micrometers, favorably 4 µm, on the substrate 1110. When the buffer layer 1120 is grown on the substrate 1110, the buffer layer 1120 may be first grown at a slow rate under high pressure conditions for, for example, 40 minutes, and may be then grown at a fast rate under low pressure conditions for, for example, 45 minutes.

In addition, GaN layer may be formed of a 3.9 µm-thick C-doped GaN layer and a 100 nm-thick i-GaN layer.

The buffer layer 1120 may be grown by a conventional process, such as MOCVD or MBE. Since the growing of the buffer layer 1120, for example, GaN, is not a central scope of the present invention and is known in the art, detailed descriptions thereof will be omitted herein.

Meanwhile, although not shown, with respect to a method for manufacturing a nitride-based semiconductor device according to another exemplary embodiment of the present invention, a transition layer (not shown) may be formed between the substrate 1110 and the buffer layer 1120. As described above, the buffer layer 1120 may include GaN. However, since GaN and sapphire, SiC, Si, or the like used for the substrate have a large difference in the lattice constant or coefficient of thermal expansion, GaN directly laminated on the substrate 1110 may cause a line defect (dislocation) and thus a leakage current. The transition layer (not shown) can decrease the difference in the lattice constant or coefficient of thermal expansion between the substrate 1110 and the buffer layer 1120 and thus prevent the flowing of the leakage current. Further, those skilled in the art can deduce, by using the known art, a constitution that another layer is inserted between the substrate 1110 and the transition layer (not shown), between the transition layer (not shown) and the buffer layer 1120, or on the buffer layer 1120, thereby further decreasing the difference in the lattice constant or coefficient of thermal expansion.

An AlGaN layer 1130 may be formed on the buffer layer 1120. The AlGaN layer 1130 may be unintentionally doped. The AlGaN layer 1130, like the buffer layer 1120, may be also grown by a conventional process such as MOCVD or MBE.

In the exemplary embodiment of the present invention, the buffer layer 1120 may include GaN and the AlGaN layer 1130 may include AlGaN, so that a GaN/AlGaN hetero-structure may be formed. The lattice constant of AlGaN is smaller than that of GaN, and thus a tensile force due to lattice mismatching may be applied to the AlGaN layer 1130, resulting in a piezoelectric effect that induces polarization in the AlGaN layer 1130.

The piezoelectric effect of the AlGaN/GaN hetero-structure may lead to the formation of 2DEG, which may be used as a channel of the semiconductor device. In particular, in the case of the GaN/AlGaN hetero-structure, the discontinuity of the conduction band has a value greater than, for example, 0.65 eV. The thus formed 2DEG may have an electron mobility of 1500 cm3/V·s and an electron saturation velocity of $2.2 \times 10^7$ cm/s based on, for example, room temperature.

Meanwhile, the AlGaN layer 1130 may be formed with a thickness of 20 nm. In $Al_xGa_{1-x}N$, the value of x may be determined to be greater than 0 but smaller than 1, and thus the energy gap of $Al_xGa_{1-x}N$ may be controlled to be 3.4 eV to 6.2 eV. The content ratio of Al and Ga may be determined to be 0.23:0.77, to thereby realize $Al_{0.23}Ga_{0.77}N$.

A GaN layer 1140 may be formed on the AlGaN layer 1130. As described above, the growing of GaN may be achieved by a conventional process, such as MOCVD or MBE.

The GaN layer 1140 may shut off the AlGaN layer 1130 from the outside, which will be later described in detail. The GaN layer 1140 may include an impurity layer therein. The GaN layer 1140 may be formed with a thickness of, for example, 3 nm. The channel electron mobility may be 1860 cm$^2$/V·s, the sheet carrier concentration may be $4.34 \times 10^{12}$ cm$^2$, and the sheet resistance may be 773 Ω/cm$^2$.

Figure 12:
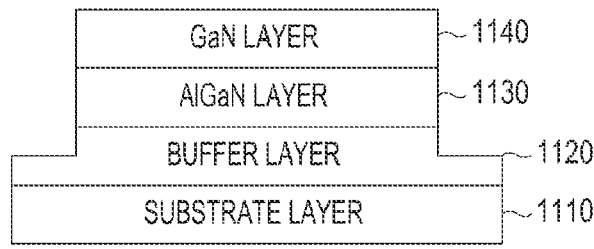
FIG. 12 is a conceptual view for describing a method for manufacturing a nitride-based semiconductor device according to an exemplary embodiment of the present invention.

FIG. 12 is a conceptual view for illustrating a method for manufacturing a nitride-based semiconductor device according to an exemplary embodiment of the present invention. As shown in FIG. 12, with respect to the manufacture of the nitride-based semiconductor device, a mesa structure may be formed by applying a mesa process to the structure of the semiconductor device as shown in FIG. 11. In this case, a portion excluding an active region of the semiconductor device may be etched.

For example, the mesa structure may be used to define the active region by $Cl_2$-based inductively coupled plasma-reactive etching. The ohmic metal Ti/Al/Ni/Au (20/80/20/100 mm) may be formed by an e-gun deposition process and a lift-off process. The ohmic metal may be annealed at 880 in the atmosphere of $N_2$ for 40 seconds.

Before Schottky contacts are formed, the structure shown in FIG. 12 may be dipped in a 30:1 a buffered oxide etchant (BOE) for 30 seconds, and may be dipped in diluted HCl in which D.I. water and HCl are mixed at a ratio of 5:1, for 1 minute.

Figure 13A:
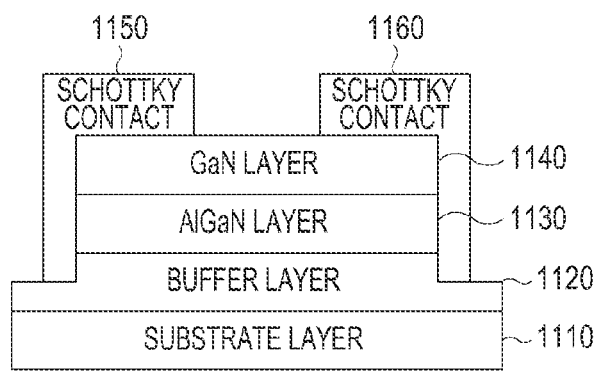
FIGS. 13A and 13B are conceptual views for describing a method for manufacturing a nitride-based semiconductor device according to an exemplary embodiment of the present invention.
Figure 15:
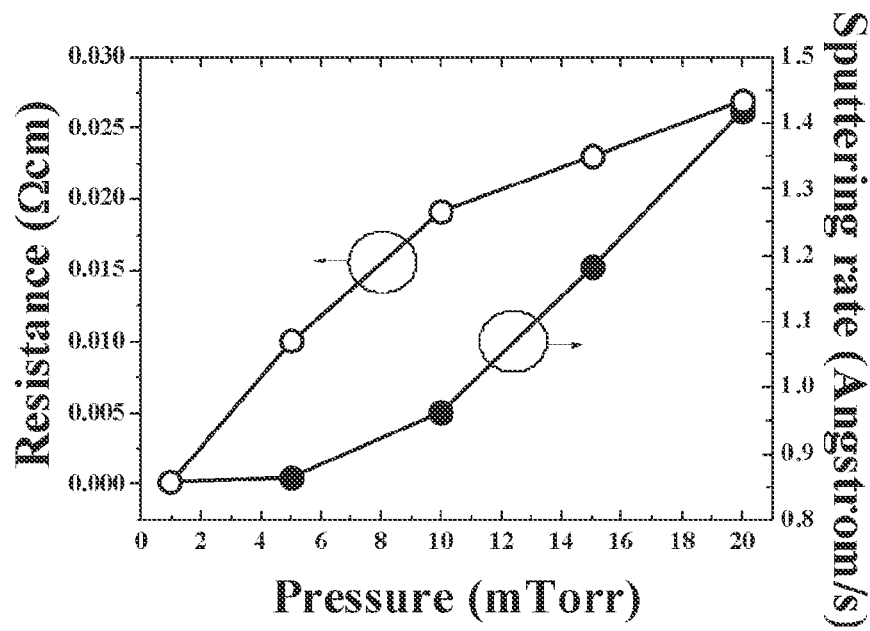
FIG. 15 is a graph showing the relationship among pressure, resistance, and sputtering rate.

In FIG. 13A, Schottky contacts of TaN 1150 and 1160 may be formed with a thickness of 43 nm. For example, the Schottky contacts 1150 and 1160 may be formed at room temperature by RF sputtering. The sputtering power, sputtering pressure, and Ar flow may be 300 W, 1 mTorr, and 20 sccm, respectively. Meanwhile, according to a comparative embodiment for comparison with the present invention, Ni/Au Schottky contacts may be formed with respective thicknesses of 30 nm and 150 nm. In this case, the distance between an anode and a cathode may be 20 μm and the depth may be 50 μm. Meanwhile, in an exemplary embodiment of the present invention, the sputtered TaN may be optimized depending on the varied pressure. This is shown in FIG. 15. This will be later described in detail. TaN is a ceramic material that is stable and is non-oxidized at a high temperature, and has been used for a Cu diffusion barrier of a silicon device. TaN is used as a gate material in a Metal Oxide Semiconductor Field Effect Transistor (MOSFET) since it has a low resistance and enables easy sputtering and depositing.

Figure 13B:
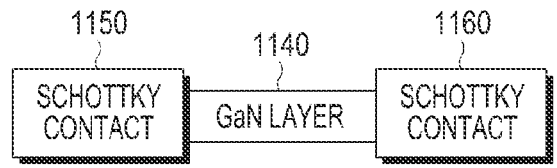

Meanwhile, as shown in FIG. 13A, the Schottky contacts 1150 and 1160 may be formed on a buffer layer 1120 as well as a GaN layer 1140. FIG. 13B is a plane view of the structure of FIG. 13A.

Figure 14A:
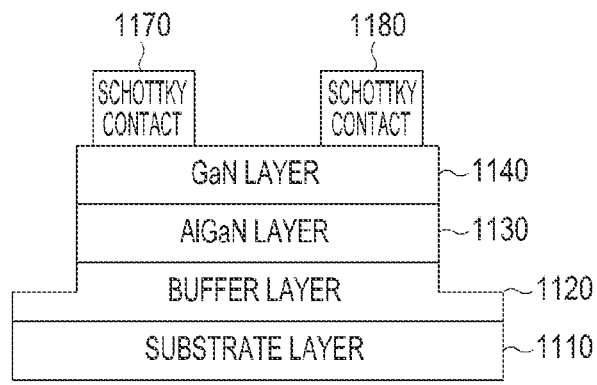
FIGS. 14A and 14B are conceptual views for describing a method for manufacturing a nitride-based semiconductor device according to another exemplary embodiment of the present invention.
Figure 14B:
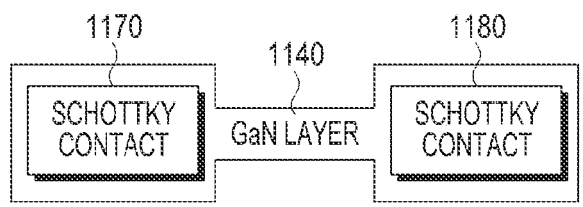

FIG. 14A shows a structure according to another exemplary embodiment of the present invention, in which Schottky contacts 1170 and 1180 are formed on only the GaN layer 1140. FIG. 14B is a plane view of the structure of FIG. 14A.

FIG. 15 is a graph for illustrating the resistance and sputtering rate of TaN. In the exemplary embodiment shown in FIG. 15, the sputtering on p-type Si is conducted at a sputtering power of 300 W for 3000 seconds. It may be confirmed from FIG. 15 that as the pressure is decreased from 20 Torr to 1 Torr, the resistance is decreased from 26.1 mΩ·cm to 244.3 μΩ·cm. It may be confirmed that the sputtering rate is decreased from 1.43/s to 0.86/s. The anodes in the devices according to embodiments of the invention are used at a pressure of 1 mTorr for the lowest resistance in the experiment.

Figure 16:
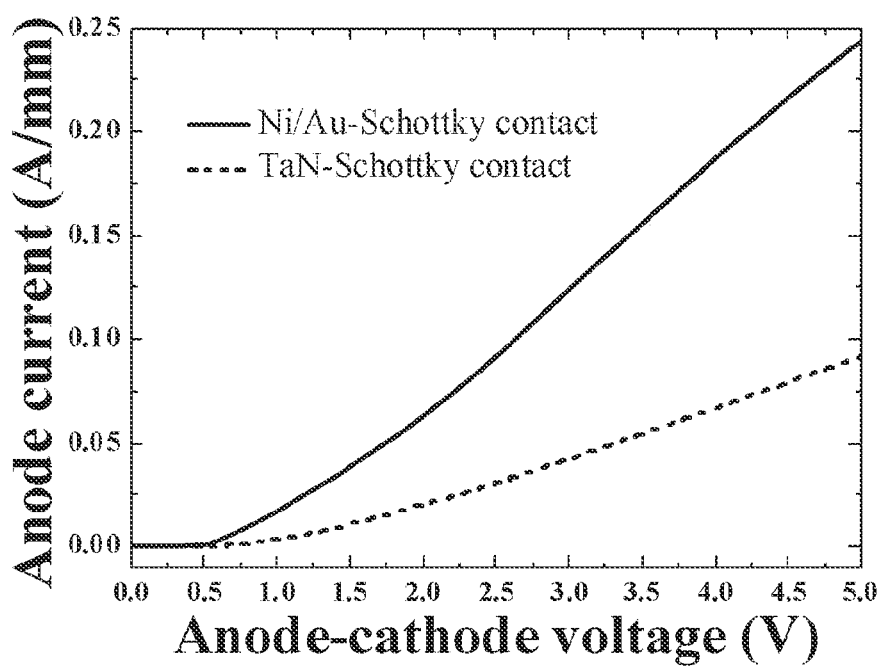
FIG. 16 is a graph showing forward characteristics of structures manufactured at room temperature according to an exemplary embodiment and a comparative embodiment of the present invention.

FIG. 16 is a graph showing forward characteristics of structures manufactured at room temperature according to an exemplary embodiment and a comparative embodiment of the present invention. It may be confirmed that, at a current value of 1 mA/mm, the forward voltage drop at anode is 0.5 V for the conventional device with a Ni/Au Schottky contact and 0.74 V for the device with a TaN Schottky contact according to an exemplary embodiment of the present invention. Further, it may be confirmed that the forward current at an anode-cathode voltage of 5V is 92 mA/mm for the device with the TaN Schottky contact according to an exemplary embodiment of the present invention, which is lower than that of the conventional device with the Ni/Au Schottky contact, 240 mA/mm. Such a decrease in the forward current is due to a higher Schottky Barrier Height (SBH) of TaN/GaN as compared with Ni/GaN. Further, such a decrease may be also due to the resistance of TaN, 244.3 μΩ·cm, which is higher than that of Au, 2.2 μΩ·cm, or that of Ni, 6.93 μΩ·cm.

Figure 17:
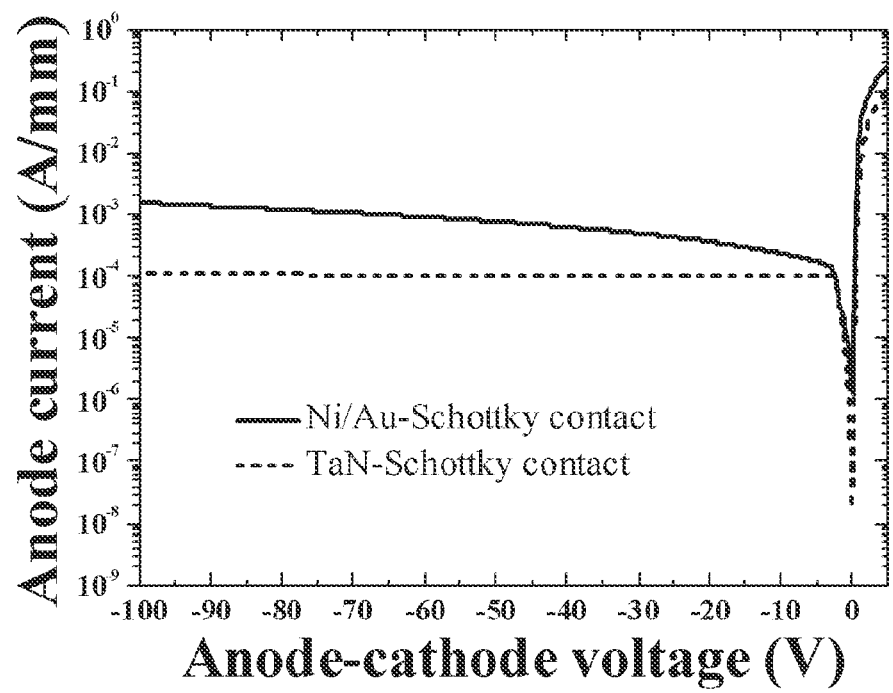
FIG. 17 is a graph showing rectifying characteristics measured at room temperature in an exemplary embodiment and a comparative embodiment of the present invention.

FIG. 17 is a graph showing the rectifying characteristics measured at room temperature in an exemplary embodiment and a comparative embodiment of the present invention. The conventional device with the Ni/Au Schottky contact has a high leakage current of 1.55 mA/mm at an anode-cathode voltage of −100 V, which may be caused by the surface trap and the trap-assisted Schottky tunneling current. However, it may be confirmed that the device with the TaN Schottky contact according to an exemplary embodiment of the present invention has a decreased leakage current of 111 μA/mm and a stable blocking characteristic. The stable blocking characteristic indicates that the TaN Schottky contact according to the present invention is better than the Ni/Au Schottky contact in view of bearing the high voltage.

The SBH ($\Phi_{BN}$) in the conventional device with the Ni/Au Schottky contact and the device with TaN Schottky contact according to an exemplary embodiment of the present invention is deduced as shown in Equation 1.

$$\Phi_{BN} = \frac{KT}{Q} \ln\left(\frac{A^{**}T^2}{J_S}\right) \quad \text{[Equation 1]}$$

In Equation 1, $J_s$ is saturation current density, obtained from I-V characteristics at 0 V. $A^{**}$ is effective Richardson constant, and may be 26.62 A·cm$^{-2}$·K$^{-2}$. T may be 300 K.

It may be confirmed that the SBH value of the device with the TaN Schottky contact according to an exemplary embodiment of the present invention is increased to 0.62 eV while the SBH value of the conventional device with Ni/Au Schottky contact is 0.51 eV. This indicates that the device with the TaN Schottky contact formed by RF sputtering according to the present invention has improved reverse characteristics.

Figure 18:
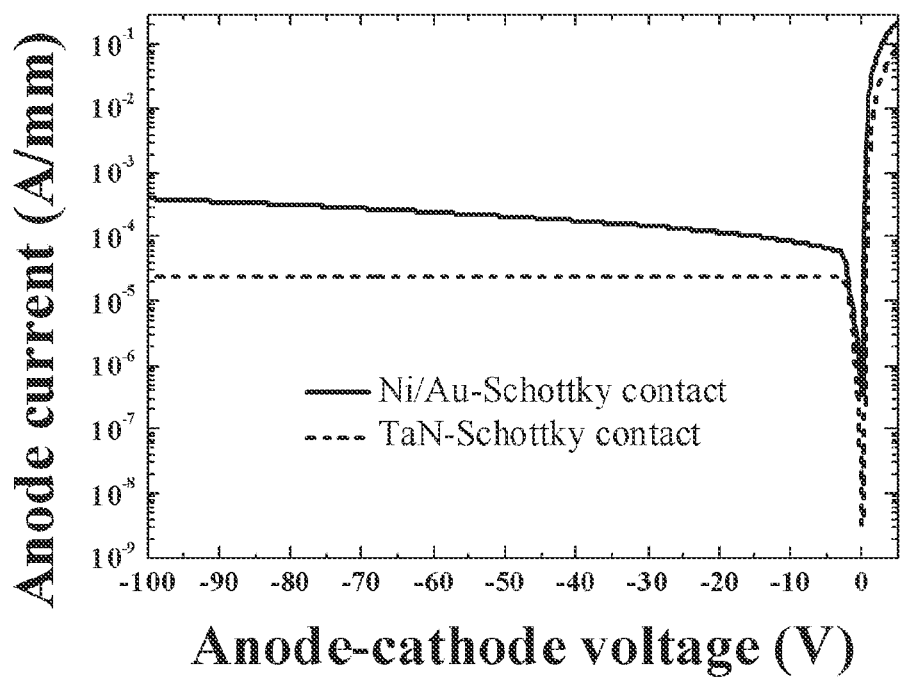
FIG. 18 is a graph showing rectifying characteristics when the anode-cathode voltage is −100 V.

FIG. 18 is a graph showing rectifying characteristics when the anode-cathode voltage is −100 V. Structures with electrodes formed on only the active region are studied in order to reduce the surface leakage current through a mesa-isolated region. It has been known that the SBH is reduced due to interface trapping between the Schottky contact and GaN. An etching process for mesa isolation may cause an etching damage.

In an exemplary embodiment of the present invention, the electrodes are not formed on a mesa etching region to thereby suppress the leakage current. As shown in FIG. 14A, in the case where there is no overlapping between the electrode and the mesa sidewall, the leakage current is 397 μA/mm for the conventional Ni/Au Schottky contact and 24.6 μA/mm for the TaN Schottky contact of the present invention. Further, the above values are reduced by about one-fourth as compared with the case where there is overlapping between the electrode and the mesa sidewall. This reduction in leakage current is due to a suppressed SBH drop, which is caused by removing the electrode on the etched GaN surface. The conventional device without the overlapping has an SBH value of 0.54 eV and the device without the overlapping according to the present invention has an SBH value of 0.67 eV.

Figure 19:
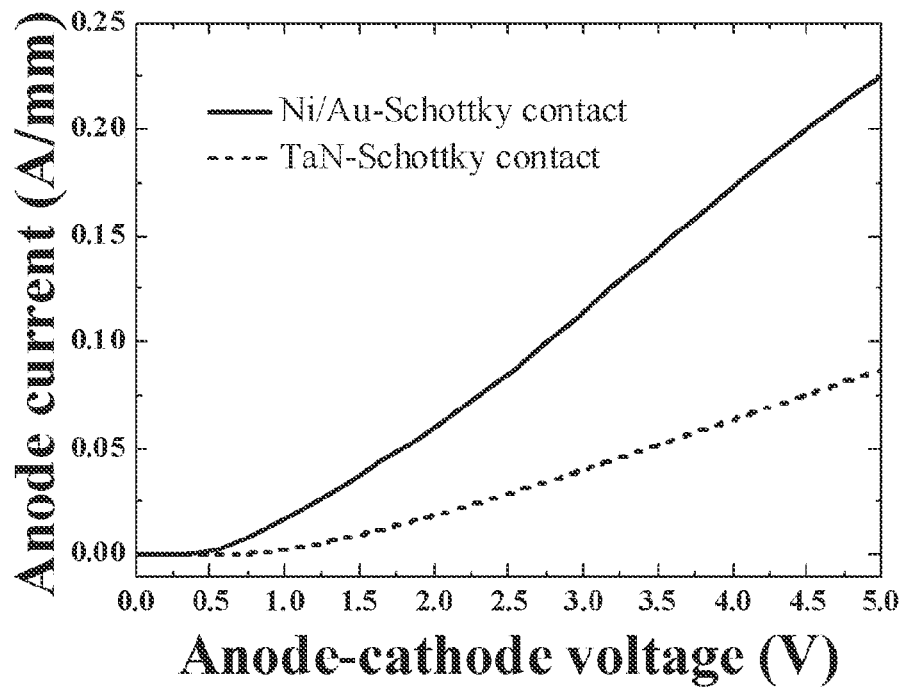
FIG. 19 is a graph illustrating the forward current and the forward voltage drop.

FIG. 19 is a graph illustrating the forward current and the forward voltage drop. The device without overlapping between electrodes and mesa sidewalls does not show rapid generation of the forward current and the forward voltage drop as compared with the device with overlapping between electrodes and mesa sidewalls. A slight change in forward current may be generated due to a reduced effective channel width in the device without overlapping. The conventional device with the Ni/Au Schottky contact has a forward voltage drop of 0.54 V when the anode-cathode voltage is 1 mA/mm and has a forward current of 230 mA/mm when the anode-cathode voltage is 5 V. The above values are, respectively, 0.84 V and 87 mA/mm for the device with the TaN Schottky contact according to the present invention.

Figure 20:
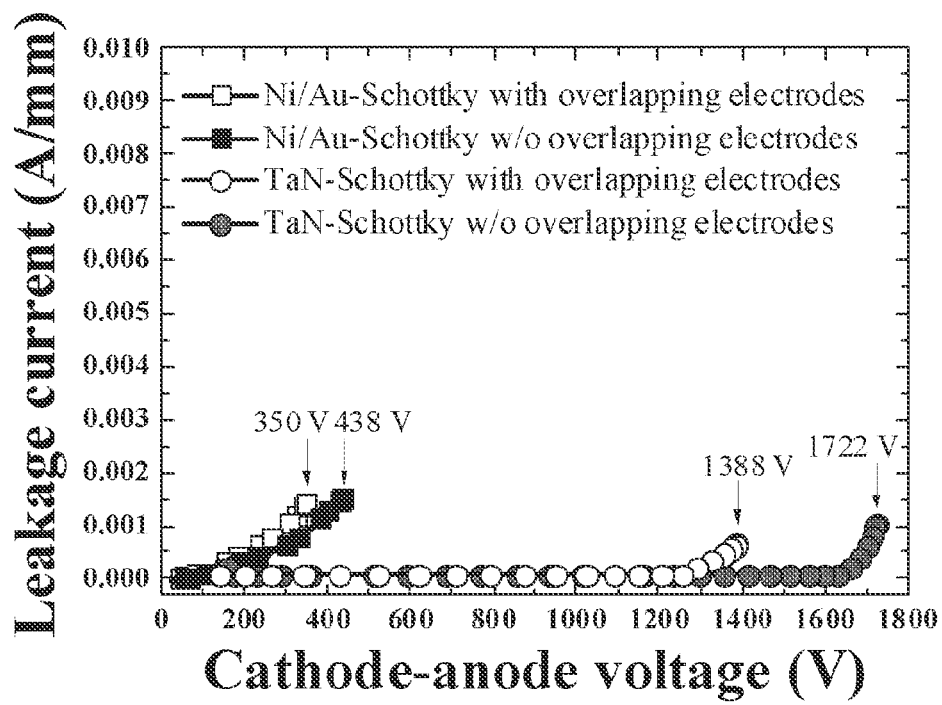
FIG. 20 is a graph for illustrating the breakdown voltage of all the devices having Ni/Au or TaN Schottky contacts with or without overlapping between mesa sidewalls and electrodes.

FIG. 20 is a graph illustrating the breakdown voltage in all devices having Ni/Au or TaN Schottky contacts with or without overlapping between mesa sidewalls and electrodes. As shown in FIG. 20, the device having the TaN Schottky contact without overlapping electrodes has a breakdown voltage of 1722 V and the device having TaN Schottky contact with overlapping electrodes has a breakdown voltage of 1388 V. It may be confirmed that the above breakdown voltages are greater than those of the devices with the Ni/Au Schottky contact (350 V and 438 V). These high breakdown voltages are due to a stable blocking characteristic and a high SBH of the TaN Schottky contact.

Figure 21:
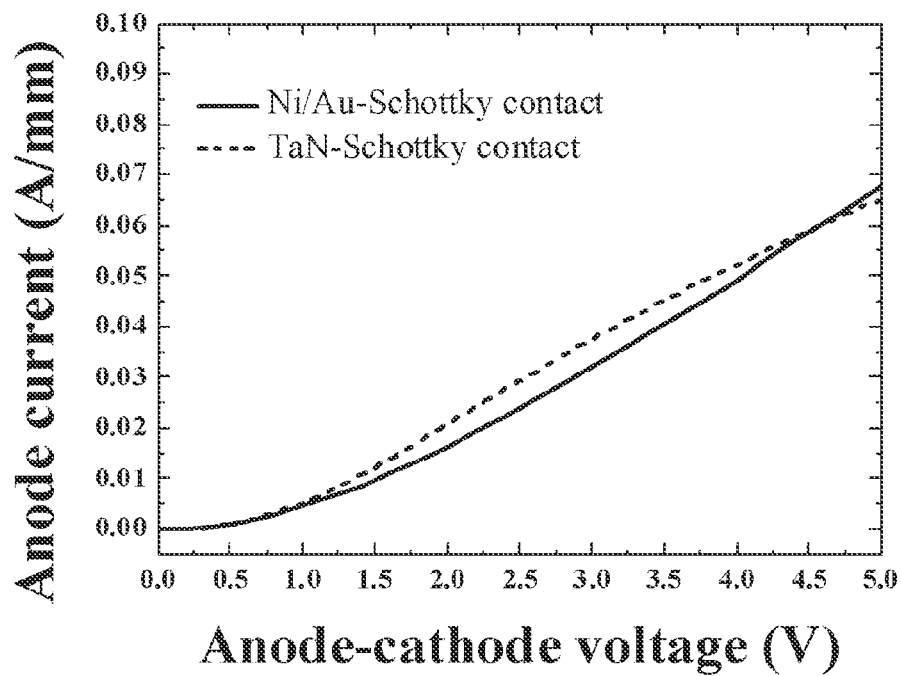
FIG. 21 is a graph showing forward characteristics when the experiment on thermal stability of the devices without overlapping between mesa sidewalls and electrodes is conducted at 250° C.
Figure 22:
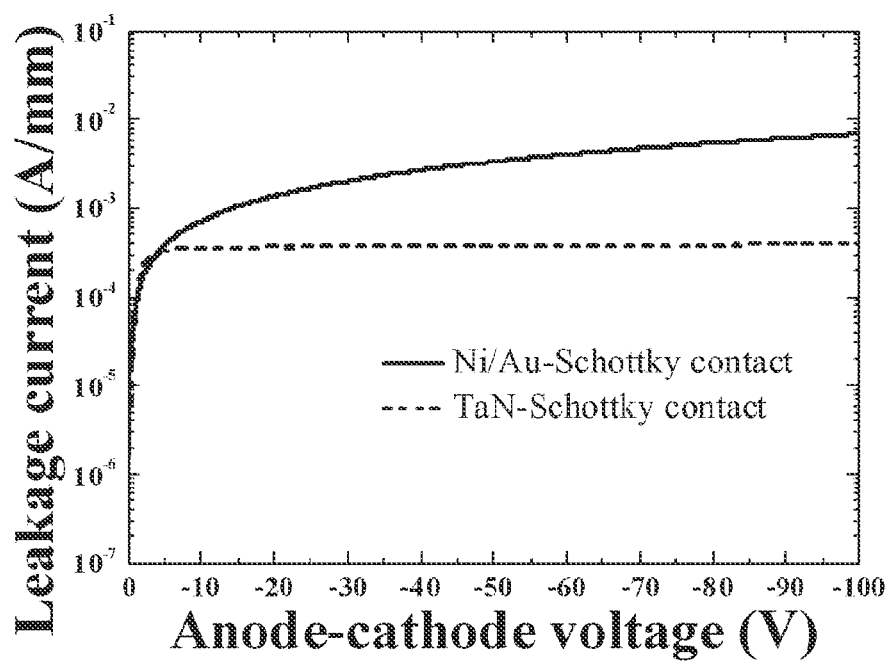
FIG. 22 is a graph showing the relationship between the anode-cathode voltage and the leakage current.

FIG. 21 is a graph showing forward characteristics when the experiment on thermal stability of the devices without overlapping between mesa sidewalls and electrodes is conducted at 250° C. The forward current reduction may be about 24.9% for the device with the TaN Schottky contact according to the present invention and may be about 70.5% for the conventional device with Ni/Au Schottky contact. The favorable thermal characteristics of TaN and the high SBH between TaN and GaN can improve thermal stability. In addition, the leakage current of the device with TaN Schottky contact may be 394 μA/mm when the anode-cathode voltage is 100 V. Whereas, the leakage current of the device with the Ni/Au Schottky contact is 6.92 mA/mm, which is shown in FIG. 22. From the results at 250° C., TaN can be an anode material suitable for the high-temperature operation.

FIG. 23 is a cross-sectional view of a structure during manufacturing of a nitride-based semiconductor device according to an exemplary embodiment of the present invention.

As shown in FIG. 23, with respect to the manufacture of a nitride-based semiconductor device, a substrate 2310 may be prepared. The substrate 2310 according to an exemplary embodiment of the present invention may consist of Si. However, Si is only an example, and thus those skilled in the art can easily substitute or change Si with sapphire, silicon carbide, or the like.

Meanwhile, in an exemplary embodiment of the present invention, the substrate 2310 may be washed before a buffer layer 2320 is formed on the substrate 2310. The substrate 2310 may be washed with trichloroethylene (TCE), aceton, and methanol solutions. Further, after washing with the foregoing solutions is completed, the substrate 2310 may be washed with a 4:1-H$_2$SO$_4$ and H$_3$PO$_4$ mixture solution and deionized water.

The buffer layer 2320 may be formed on the substrate 2310. The buffer layer 2320 may include GaN. The buffer layer 2320 may be grown to have a thickness of, for example, several micrometers, favorably 3.9 μm, on the substrate 2310. When the buffer layer 2320 is grown on the substrate 2310, the buffer layer 2320 may be first grown at a slow rate under high pressure conditions for, for example, 40 minutes, and may be then grown at a fast rate under low pressure conditions for, for example, 45 minutes. The buffer layer 2320 may include, for example, C-doped GaN, for high-resistance characteristics.

The buffer layer 2320 may be grown by a conventional process, such as MOCVD or MBE. Since the growing of the buffer layer 2320, for example, GaN, is not a central scope of the present invention and is known in the art, detailed descriptions thereof will be omitted herein.

Meanwhile, although not shown, with respect to a method for manufacturing a nitride-based semiconductor device according to another exemplary embodiment of the present invention, a transition layer (not shown) may be formed between the substrate 2310 and the buffer layer 2320. As described above, the buffer layer 2320 may include GaN. However, since GaN and sapphire, SiC, Si, or the like used for the substrate have a large difference in the lattice constant or coefficient of thermal expansion, GaN directly laminated on the substrate 2310 may cause a line defect (dislocation) and thus a leakage current. The transition layer (not shown) can decrease the difference in the lattice constant or coefficient of thermal expansion between the substrate 2310 and the buffer layer 2320 and thus prevent the flowing of the leakage current. Further, those skilled in the art can deduce, by using the known art, a constitution that another layer is inserted between the substrate 2310 and the transition layer (not shown), between the transition layer (not shown) and the buffer layer 2320, or on the buffer layer 2320, thereby further decreasing the difference in the lattice constant or coefficient of thermal expansion.

A spacer 2330 may be formed on the buffer layer 2320. Here, the spacer 2320 may include GaN, and may be formed with a thickness of 1 to 2 nm.

In the exemplary embodiment of the present invention, the spacer 2330 may include GaN and a barrier layer 2340 may include AlGaN, so that a GaN/AlGaN hetero-structure may be formed. The lattice constant of AlGaN is smaller than that of GaN, and thus a tensile force due to lattice mismatching may be applied to the barrier layer 2340, resulting in a piezoelectric effect that induces polarization in the barrier layer 2340.

The piezoelectric effect of the AlGaN/GaN hetero-structure may lead to the formation of 2DEG, which may be used as a channel of the semiconductor device. In particular, in the case of the GaN/AlGaN hetero-structure, the discontinuity of the conduction band has a value greater than, for example, 0.65 eV. The thus formed 2DEG may have an electron mobility of 1500 $cm^3/V \cdot s$ and an electron saturation velocity of $2.2 \times 10^7$ cm/s based on, for example, room temperature.

Meanwhile, the barrier layer 2340 may be formed with a thickness of 20 nm. The barrier layer may include AlGaN. In $Al_xGa_{1-x}N$, the value of x may be determined to be greater than 0 but smaller than 1, and thus the energy gap of $Al_xGa_{1-x}N$ may be controlled to be 3.4 eV to 6.2 eV. The content ratio of Al and Ga may be determined to be 0.23:0.77, to thereby realize $Al_{0.23}Ga_{0.77}N$.

A protecting layer 2350 may be formed on the barrier layer 2340. The protecting layer 2350 may include, for example, GaN, and may be formed with a thickness of 3 nm. As described above, the growing of GaN may be achieved by a conventional process, such as MOCVD or MBE.

The protecting layer 2350 may shut off the AlGaN layer 1130 from the outside, which will be later described in detail. The protecting layer 2350 may include an impurity layer therein.

FIG. 24 is a conceptual view for illustrating a method for manufacturing a nitride-based semiconductor device according to a comparative embodiment of the present invention.

As shown in FIG. 24, an insulating layer ($HfO_2$) 2360 may be formed by, for example, RF sputtering.

Figure 25:
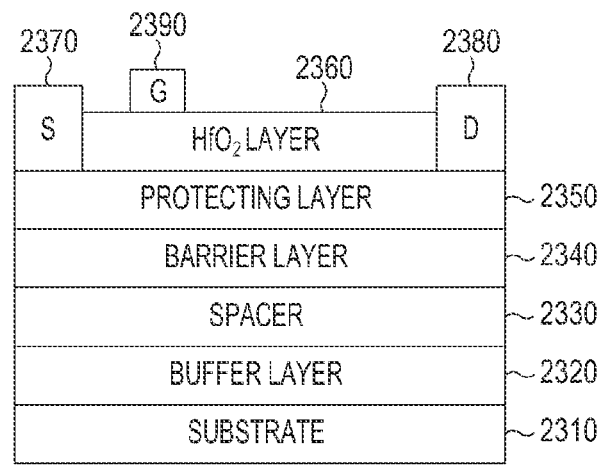
FIG. 25 is a cross-sectional view of a structure during manufacturing of a nitride-based semiconductor device according to a comparative embodiment of the present invention.

FIG. 25 is a cross-sectional view of a structure during manufacturing of a nitride-based semiconductor device according to a comparative embodiment of the present invention. As shown in FIG. 25, an insulating layer 2360 may be formed, and a source electrode 2370 and a drain electrode 2380 may be formed on a protecting layer 2350. In addition, a gate electrode 2390 may be formed on the insulating layer 2360. The gate electrode 2390 may be relatively closer to the source electrode 2370 than the drain electrode 2380.

Through the foregoing procedure, a nitride-based semiconductor device including the insulating layer 2360 may be formed.

In the comparative example shown in FIG. 25, the source electrode 2370 and the gate electrode 2390 are spaced apart from each other at a predetermined distance. Therefore, the internal resistance may be generated due to the predetermined distance.

Figure 26:
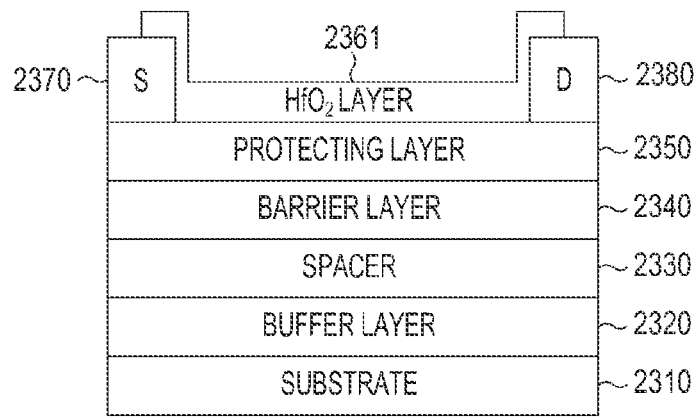
FIG. 26 is a cross-sectional view of a nitride-based semiconductor device according to an exemplary embodiment of the present invention.

Meanwhile, FIG. 26 is a cross-sectional view of a nitride-based semiconductor device according to an exemplary embodiment of the present invention. As shown in FIG. 26, a source electrode 2370 may be formed on a first region of a protecting layer 2350 and the drain electrode 2380 may be formed on a second region thereof.

The source and drain electrodes 2370 and 2380 may be formed by sequentially depositing Ti/Al/Ni/Au with respective thicknesses of 20 nm, 80 nm, 20 nm, and 100 nm, followed by a process using an e-gun evaporator and a lift-off process, and then annealed at 880° C. in the atmosphere of $N_2$ for 40 seconds.

After the source and drain electrodes 2370 and 2380 are formed, a subsequent heating process may be further performed at 400° C. in the atmosphere of $O_2$ having a flow rate of 4 SLPM for 5 minutes.

In addition, an insulating layer 2361 may be extended on a third region of the protecting layer 2350 and a portion of the source electrode 2370. Meanwhile, before the insulating layer 2361 is formed, the structure may be dipped in a 30:1 buffered oxide etchant for 30 seconds to remove oxides. In addition, the insulating layer 2361 may be formed as an $HfO_2$ layer by RF sputtering, and may have a thickness of, for example, 15 nm.

The RF sputtering has gained attention due to a low temperature, a low cost, and superior thickness control. In addition, the RF sputtering has an advantage in that a layer having the same composition ratio as a source material is formed. Besides, the $HfO_2$ layer 2361 formed by RF sputtering can result in a high on/off current ratio and a high breakdown voltage. The insulating layer 2361 may be formed with a thickness of, for example, 15 nm, and the RF sputtering power may be 50 W. In addition, the insulating layer 2361 may be formed at room temperature at an Ar flow of 15 ccm or smaller, and the pressure at the time of forming the $HfO_2$ layer 160 may be 3 mTorr. The insulating layer 2361 may be formed at a deposition rate of, for example, 0.5 nm/s.

Figure 27:
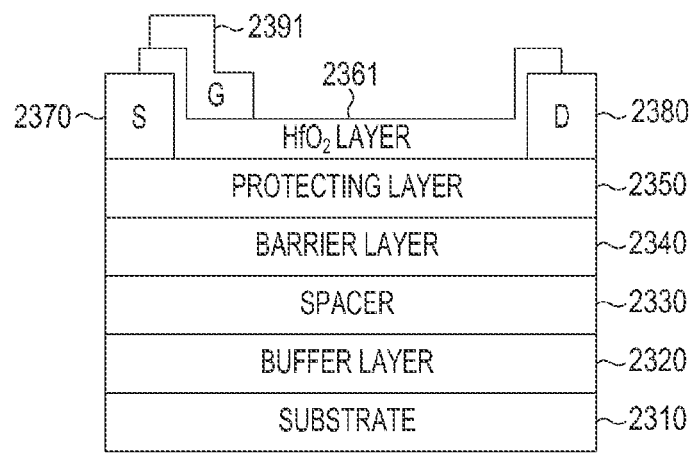
FIG. 27 is a cross-sectional view of a semiconductor device according to an exemplary embodiment of the present invention.

FIG. 27 is a cross-sectional view of a semiconductor device according to an exemplary embodiment of the present invention.

As shown in FIG. 27, a gate electrode 2391 may be formed on the insulating layer 2361, and may be also formed on the source electrode 2370. The gate electrode 2391 may be formed of one or more of TaN, Ni, Pt, Ir, Pd, Mo, and Au. Particularly, in the case where the gate electrode 2391 is formed of TaN, the gate electrode 2391 may be formed at room temperature by an RF sputtering process. The sputtering power, sputtering pressure, and Ar flow may be 300 W, 1 mTorr, and 15 sccm, respectively. TaN is a ceramic material, which is stable and is non-oxidized at a high temperature, and has been used for a Cu diffusion barrier of a silicon device. TaN is used as a gate material in the MOSFET since it has a low resistance and enables easy sputtering and depositing.

In FIG. 27, the length of the gate electrode 2391 and the distance between the gate electrode 2391 and the drain electrode 2380 may be 3 μm and 10 μm, respectively. In particular, the gate electrode 2391 and the source electrode 2370 may be substantially adjacent to each other to thereby significantly reduce the internal resistance.

Figure 28:
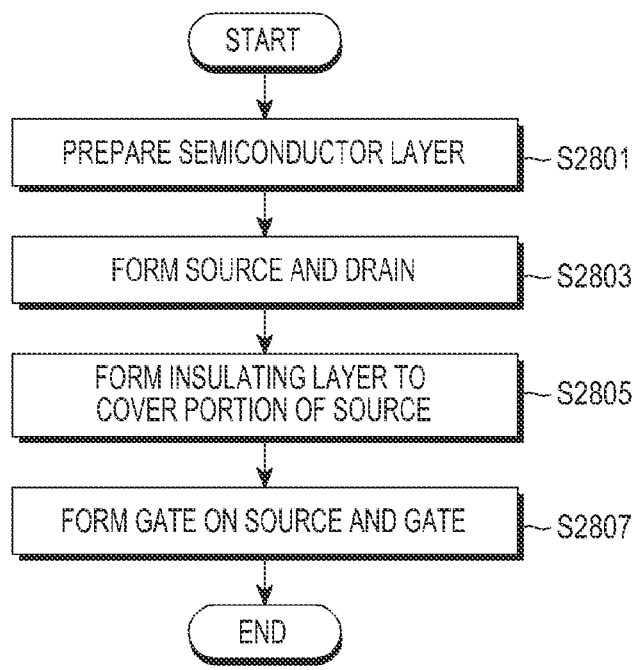
FIG. 28 is a flowchart for illustrating a method for manufacturing a semiconductor device according to an exemplary embodiment of the present invention.

FIG. 28 is a flowchart for illustrating a method for manufacturing a semiconductor device according to an exemplary embodiment of the present invention.

As shown in FIG. 28, for manufacturing a nitride-based semiconductor device, a nitride-based semiconductor layer is first prepared (S2801). For example, the manufacture of the nitride-based semiconductor device may include preparing a substrate, forming a buffer layer on the substrate, forming a spacer on the buffer layer, forming a barrier layer on the spacer, and forming a protecting layer on the barrier layer.

When the nitride-based semiconductor layer is formed, a source electrode may be formed on a first region and a drain electrode may be formed on a second region (S2803). After the source electrode and the drain electrode are formed, an insulating layer is formed to cover a third region of the nitride-based semiconductor layer and a portion of the source electrode (S2805). After the insulating layer is formed, a gate electrode may be formed on the insulating layer and over the source electrode (S2807).

Figure 29:
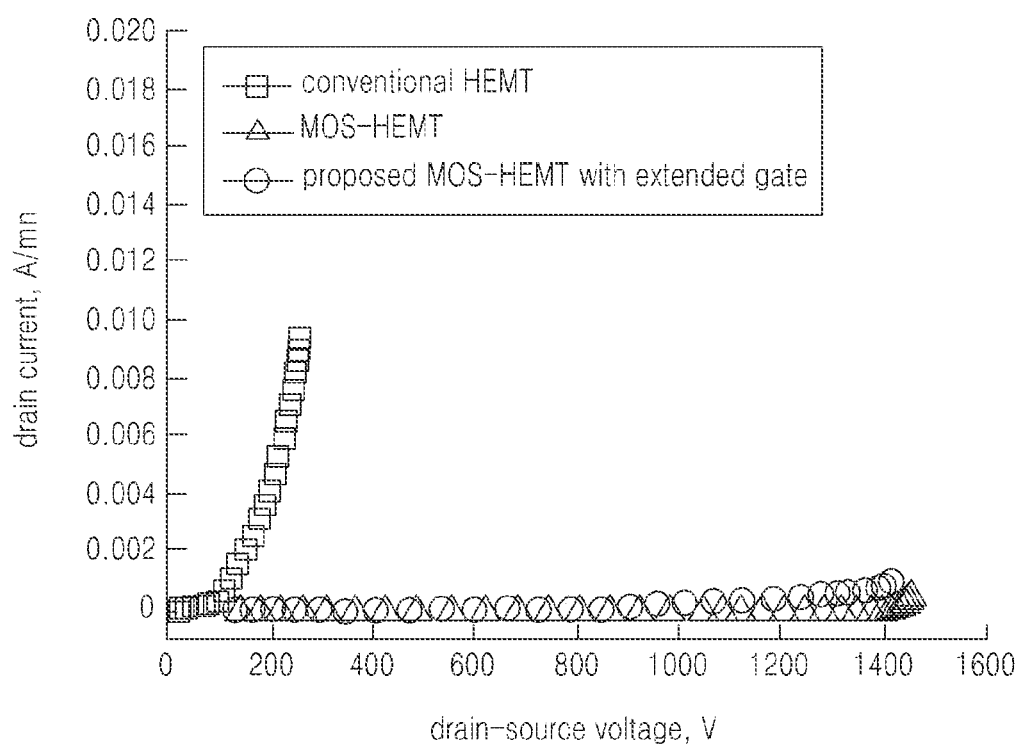
FIG. 29 is a graph showing the breakdown characteristics in a conventional HEMT, a MOS-HEMT, and a semiconductor device according to an exemplary embodiment of the present invention.

FIG. 29 is a graph showing breakdown characteristics in a conventional HEMT, a MOS-HEMT, and a semiconductor device according to an exemplary embodiment of the present invention. The graph of FIG. 29 shows the relationship between the drain-source voltage and the drain current. In FIG. 29, characteristic curves corresponding to the conventional HEMT, the MOS-HEMT, and the semiconductor device according to the present invention are represented by squares, triangles, and circles, respectively. In addition, the experimental measurement of FIG. 29 may be conducted at $V_{GS}$ of −4 V. The characteristic curve corresponding to the conventional HEMT shows a relatively low breakdown voltage, which may be due to defaults related to the surface state. Meanwhile, the MOS-HEMT has a relatively high breakdown voltage of 1460 V at a drain leakage current of 1 mA/mm, and the semiconductor device according to an exemplary embodiment of the present invention has a relatively high breakdown voltage of 1410 at a drain leakage current of 1 mA/mm. In the same condition, the conventional HEMT has a breakdown voltage of 120 V.

The improvement in breakdown voltage as described above results from the suppressed leakage current due to the $HfO_2$ insulating layer. The drain leakage current is 8.98 pA/mm for the semiconductor device according to an exemplary embodiment of the present invention and 638 μA/mm for the conventional HEMT when $V_{GS}$ is −4 V and $V_{DS}$ is 10 V.

The insulating layer is required to have a breakdown voltage higher than the critical value, for stable switch operation and high-current characteristics. However, a thick insulating layer may cause a negative shift of the critical value. In the exemplary embodiment of the present invention, when a 15 nm-thick $HfO_2$ insulating layer is formed, the critical value may be increased from −3.3 V to 5 V when the drain current is 1 mA/mm.

Figure 30:
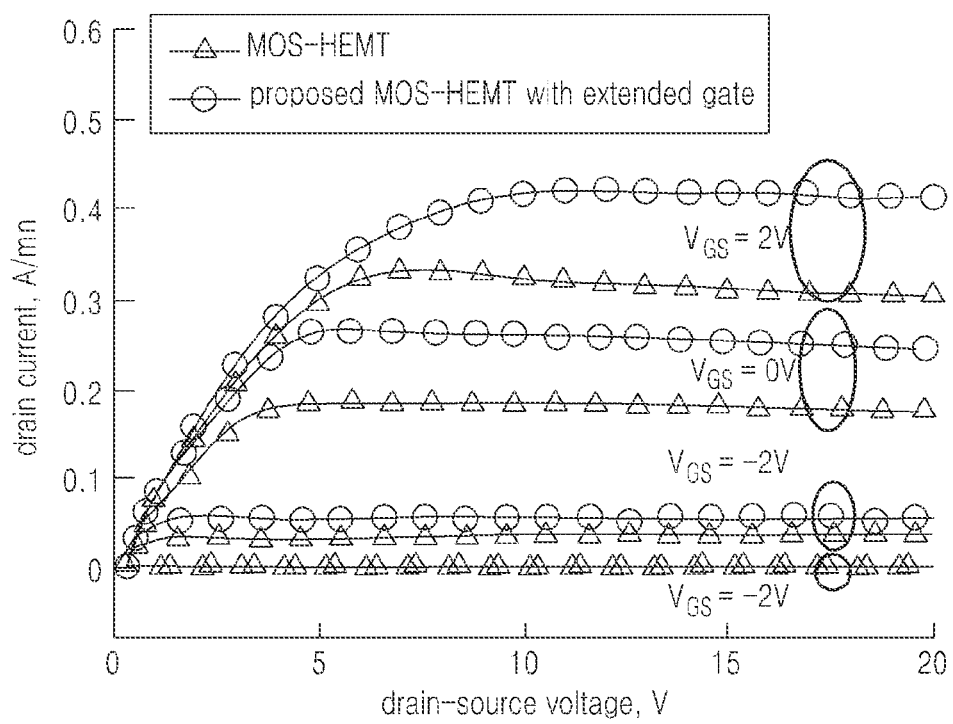
FIG. 30 is a graph showing output power-output voltage characteristics in a MOS-HEMT as a comparative embodiment of the present invention (type II) and a semiconductor device according to an exemplary embodiment of the present invention.

FIG. 30 is a graph showing output power-output voltage characteristics of the MOS-HEMT as a comparative embodiment of the present invention (type II) and the semiconductor device according to an exemplary embodiment of the present invention. In FIG. 30, the output power-output voltage characteristic curves for the MOS-HEMT as a comparative example of the present invention (type II) and the semiconductor device according to an exemplary embodiment of the present invention may be represented by triangles and circles, respectively.

In FIG. 30, the $V_{GS}$ is changed from 2 V to −4 V by the −2V unit under the measurement. When $V_{GS}$ is 2 V, the maximum value of the drain current may be increased from 332 mA/mm to 420 mA/mm. This is due to the decreased distance between the gate electrode and the source electrode, caused by the extended insulating layer and gate electrode. When using $I_{D,ON}$ at $V_{GS}$ of 4 V and $V_{DS}$ of 10 V and $I_{D,OFF}$ at $V_{GS}$ of −4 V and $V_{DS}$ of 10 V, the semiconductor device according to an exemplary embodiment of the present invention has a high on/off current ratio of $4.97 \times 10^{10}$. Meanwhile, the conventional HEMT as a comparative example of the present invention has an on/off current ratio of $4.65 \times 10^2$.

In FIG. 30, the specific on-resistance ($R_{on} \times A$) is deduced from the I-V characteristics when $V_{DS}$ and $V_{GS}$ are 2 V. The specific on-resistance is reduced from 2.91 mΩ·cm$^2$ to 2.28 mΩ·cm$^2$, which is due to the extended insulating layer and gate electrode. In addition, the semiconductor device according to an exemplary embodiment of the present invention has a high degree of $BV^2/(R_{on} \times A)$, 872 MW·cm$^{-2}$, while the $BV^2/(R_{on} \times A)$ value is 5.82 MW·cm$^{-2}$ for the conventional HEMT and 734 MW·cm$^{-2}$ for the MOS-HEMT without the extended gate.

In other words, the device with the extended insulating layer and gate electrode according to an exemplary embodiment of the present invention has a high breakdown voltage of 1410 V, which is attributed to the surface passivation and the suppression of the gate leakage current. In addition, the semiconductor device according to an exemplary embodiment of the present invention has a low specific on-resistance of 2.282 mΩ·cm$^2$, which is attributed to the decreased distance between the gate electrode and the source electrode.

According to various exemplary embodiments of the present invention, there can be formed a nitride-based semiconductor device including $HfO_2$ by RF sputtering. The nitride-based semiconductor including $HfO_2$ can ease the restriction that the gate insulating layer needs to be a relatively thin film. Further, the nitride-based semiconductor device including $HfO_2$ can have relatively high breakdown voltage and high on/off current ratio, and can also further reduce the leakage current as compared with the conventional art.

Further, according to various exemplary embodiments of the present invention, there can be provided a nitride-based semiconductor device with TaN contact and a manufacturing method thereof. The nitride-based semiconductor device with TaN contact has a higher breakdown voltage and a lower leakage current than the conventional semiconductor device with Ni—Au contact. Further, the manufacturing cost thereof can be reduced by excluding Au.

According to various exemplary embodiments of the present invention, there can be provided a nitride-based semiconductor device in which an insulating layer is extended to above a portion of the source electrode and a manufacturing method thereof. Therefore, the distance between the source electrode and the gate electrode is decreased, so that there can be provided a nitride-based semiconductor device having a reduced internal resistance.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. A method for manufacturing a nitride-based semiconductor device, the method comprising:
   preparing a substrate;
   forming a buffer layer on the substrate, the buffer layer preventing dislocation with the substrate;
   forming a spacer on the buffer layer;
   forming a barrier layer on the spacer, the barrier layer forming a hetero-structure with the spacer;
   forming a protecting layer on the barrier layer; and
   forming an $HfO_2$ layer on the protecting layer through RF sputtering.

2. The method of claim 1, further comprising:
   between the forming of the protecting layer and the forming of the $HfO_2$ layer,
   forming a source electrode on a partial region of the protecting layer; and
   forming a drain electrode on another partial region of the protecting layer.

3. The method of claim 2, wherein, in the forming of the $HfO_2$ layer, the $HfO_2$ layer is formed on the protecting layer correspondingly to a portion excluding the source electrode and the drain electrode.

4. The method of claim 2, further comprising forming a gate electrode on the $HfO_2$ layer.

5. The method of claim 4, wherein the source and drain electrodes are formed of one or more of Ti, Al, Ni and Au and the gate electrode is formed of one or more of Ni, Pt, Ir, Pd, Mo, and Au.

6. The method of claim 1, wherein the buffer layer is formed of GaN.

7. The method of claim 6, further comprising, after the preparing of the substrate but before the forming of the buffer layer on the substrate, forming a transition layer on the substrate, the transition layer growing an epi-structure of a first nitride-based semiconductor.

8. The method of claim 1, wherein the spacer and the protecting layer each include GaN and the barrier layer includes AlGaN.

9. The method of claim 8, wherein a content ratio of Al:Ga:N in the barrier layer is 23:77:100.

10. The method of claim 1, wherein the buffer layer has a thickness of 3.9 μm,
    wherein the spacer has a thickness of 100 nm,
    wherein the barrier layer has a thickness of 20 nm, and
    wherein the protecting layer has a thickness of 3 nm.

11. The method of claim 1, further comprising, after the forming of the protecting layer, performing a mesa process to form a mesa structure.

12. The method of claim 11, wherein, in the forming of the mesa structure, a portion of a nitride-based semiconductor is etched in the atmosphere of $Cl_2$ by using an Inductively Coupled Plasma (ICP) etcher.

* * * * *